(12) United States Patent
Van 'T Oever et al.

(10) Patent No.: US 9,573,804 B2
(45) Date of Patent: Feb. 21, 2017

(54) METHOD OF BONDING TWO SUBSTRATES AND DEVICE MANUFACTURED THEREBY

(71) Applicant: Micronit Microfluidics B.V., Enschede (NL)

(72) Inventors: Ronny Van 'T Oever, Epse (NL); Marko Theodoor Blom, Enschede (NL); Jeroen Haneveld, Lochem (NL); Johannes Oonk, Enschede (NL); Marinus Bernardus Olde Riekerink, Losser (NL); Peter Tijssen, Enschede (NL); Hendrik Jan Hildebrand Tigelaar, Enschede (NL); Jean-Noël Fehr, Neuchâtel (CH); Jean-Christophe Roulet, Lignieres (CH); Amitava Gupta, Roanoke, VA (US)

(73) Assignee: Micronit Microfluidics B.V., Enschede (NL)

( * ) Notice: Subject to any disclaimer, the term of this patent is extended or adjusted under 35 U.S.C. 154(b) by 22 days.

(21) Appl. No.: 14/361,683

(22) PCT Filed: Dec. 21, 2012

(86) PCT No.: PCT/NL2012/050922
§ 371 (c)(1),
(2) Date: May 29, 2014

(87) PCT Pub. No.: WO2013/095147
PCT Pub. Date: Jun. 27, 2013

(65) Prior Publication Data
US 2014/0335301 A1    Nov. 13, 2014

(30) Foreign Application Priority Data

Dec. 23, 2011 (EP) .................................. 11195720

(51) Int. Cl.
*B81C 1/00* (2006.01)
*H01L 23/10* (2006.01)
(Continued)

(52) U.S. Cl.
CPC .......... *B81C 1/00269* (2013.01); *B81C 3/001* (2013.01); *C23F 1/02* (2013.01); *H01L 21/50* (2013.01);
(Continued)

(58) Field of Classification Search
CPC ......... B81C 1/00269; B81C 3/001; C23F 1/02
(Continued)

(56) References Cited

U.S. PATENT DOCUMENTS

3,665,589 A    5/1972  Farrell
6,353,202 B1   3/2002  Grotsch et al.
(Continued)

*Primary Examiner* — Brent O'Hern
(74) *Attorney, Agent, or Firm* — Rudy J. Ng; Bret E. Field; Bozicevic, Field & Francis LLP (57) ABSTRACT

The invention relates to method for bonding at least two substrates, for example made from glass, silicon, ceramic, aluminum, or boron, by using an intermediate thin film metal layer for providing the bonding, said method comprising the following steps of: a) providing said two substrates; b) depositing said thin film metal layer on at least a part of a surface of a first substrate of the two substrates; c) bringing a surface of the second substrate into contact with said thin film metal layer on said surface of the first substrate such that a bonding between the second substrate and the thin film metal layer on the first substrate is provided; and d) at least locally strengthening the bonding between the second substrate and the thin film metal layer on the first substrate. The invention also relates to a device comprising two substrates, for example made from glass, silicon, ceramic, aluminum, or boron, and an intermediate thin film metal layer.

20 Claims, 5 Drawing Sheets

(51) Int. Cl.
*H01L 21/50* (2006.01)
*B81C 3/00* (2006.01)
*C23F 1/02* (2006.01)

(52) U.S. Cl.
CPC .......... *H01L 23/10* (2013.01); *B81B 2201/058* (2013.01); *B81C 2203/019* (2013.01); *B81C 2203/0118* (2013.01); *H01L 2924/0002* (2013.01); *Y10T 428/239* (2015.01)

(58) Field of Classification Search
USPC .......................................................... 428/76
See application file for complete search history.

(56) References Cited

U.S. PATENT DOCUMENTS

| | | |
|---|---|---|
| 2004/0065717 A1* | 4/2004 | Saijo ................ B23K 20/04 228/115 |
| 2004/0082145 A1* | 4/2004 | Reichenbach ........ B29C 65/608 438/455 |
| 2004/0238600 A1 | 12/2004 | Tarn |
| 2004/0259325 A1 | 12/2004 | Gan |
| 2006/0115323 A1 | 6/2006 | Coppeta et al. |
| 2009/0029526 A1 | 1/2009 | Chang-Chien |
| 2009/0205371 A1 | 8/2009 | Chen |
| 2010/0084751 A1 | 4/2010 | Frederick et al. |
| 2010/0327443 A1 | 12/2010 | Kim |
| 2013/0112650 A1 | 5/2013 | Karam et al. |

\* cited by examiner

METHOD OF BONDING TWO SUBSTRATES AND DEVICE MANUFACTURED THEREBY

The invention relates to a method for bonding at least two substrates, for example made from glass, silicon, ceramic, aluminum, or boron.

Known methods for bonding at least two substrates, for example made from glass, silicon or ceramic, make use of heating the two substrates after they are brought into contact with each other. However, for certain applications heating of the two substrates in order to provide the bonding is undesirable. For example, substrates provided with an organic-based anti-stiction coating and/or immobilized molecules are temperature sensitive and cannot be heated.

It is therefore an object of the invention to provide a method for bonding two substrates, for example made from glass, silicon or ceramic, that allows for other means for bonding than heating.

This objective is achieved by a method according to the preamble and by using an intermediate thin film metal layer for providing the bonding, said method comprising the following steps of:

a) providing said two substrates;

b) depositing said thin film metal layer on at least a part of a surface of a first substrate of the two substrates;

c) bringing a surface of the second substrate into contact with said thin film metal layer on said surface of the first substrate such that a bonding between the second substrate and the thin film metal layer on the first substrate is provided; and d) at least locally strengthening the bonding between the second substrate and the thin film metal layer on the first substrate.

Providing a thin film metal layer between the two substrates has the advantage that this allows the bonding between the two substrates and the thin film metal layer to be strengthened by various means. Such various means will be described below with respect to different embodiments of the method according to the invention.

The thin film metal layer may have a maximum thickness of about 500 nm, preferable a maximum thickness of about 250 nm, even more preferable approximately 40 nm. It is found that with such a thin film metal layer a good initial bonding between the thin film metal layer and the second substrate is provided after step (c). Such an initial bonding allows for an easy handling of the device produced by the method according to the invention, which device comprises the two substrates and the intermediate thin film metal layer, even before the bonding is strengthened in step (d). The device produced by the method according the invention may be a so called microelectromechanical system (MEMS) device or a microfluidic device or chip.

A plurality of substrates may be bonded by means of the method according to the invention.

Each substrate may comprise glass, silicon, ceramic, or a combination thereof. For example, two glass substrates may be bonded to each other by the method according to the invention, such that a glass-metal-glass device is obtained. The two glass substrates may comprise borosilicate, soda lime, sapphire or quartz. Alternatively, such a glass substrate may be bonded to a silicon substrate, such that a glass-metal-silicon device is obtained.

In order to provide a good bonding between the two substrates and the thin film metal layer, the first substrate and/or the second substrate is preferably cleaned, at least previous to step (b) and/or respectively step (c). Such surface cleaning is known per se and suitable conventional cleaning means may be used.

In an embodiment of the method according to the invention said thin film metal layer comprises a metal chosen from the group comprising palladium, copper, tungsten, aluminum, cobalt, nickel, thalium, ruthenium, iron, molybdenum, stainless steel, chromium, tantalum, vanadium, and titanium, and wherein said thin film metal layer comprises a metal oxide layer.

The applicant has found that as a result of the metal oxide layer a bonding between the two substrates and the thin film metal layer comprising the metal oxide layer is provided. In particular, the metals chosen from this group and comprising said oxide layer promote bonding by chemical interaction of the metal oxide with the substrate forming oxo bridges, as for example, M-O—S— bonds at the surface of the substrates. Here, substrate S is for example silicon (Si), aluminum (Al), Boron (B), glass or ceramic. Metal M is for example palladium (Pd), copper (Cu), tungsten (W), aluminum (Al), cobalt (Co), nickel (Ni), thalium (Ti), ruthenium (Ru), iron (Fe), molybdenum (Mo), stainless steel, chromium (Cr), tantalum (Ta), vanadium (V), or titanium (Ti). In each case, the metal is capable of existing in one of several stable oxidation states, ranging from 2+ in case of Ni (NiO) to 5+ in case of Ta ($Ta_2O_5$), and it is preferably a transition metal or a lanthanide. Most preferred are metals such as Cr (forming CrO, $Cr_2O_3$, $Cr_2 O_5$) which can form stable oxo bridged anions such as chromates and perchromates. The thickness of the metal oxide layer may be chosen in accordance with the required bonding strength. The thin film metal layer may be integrally formed with the metal oxide layer or the metal oxide layer may a layer on the thin film metal layer. The applicant has found that particularly chromium and tantalum are suitable for bonding the two substrates.

In an alternative embodiment of the method according to the invention said thin film metal layer comprises a metal chosen from the group comprising silver, platinum and gold.

Such metals do not form metal oxide and are soft, so deformable, enabling the formation of an extended molecular contact that covers the entire bonding area without any microscopic air gaps or gaps under vacuum in which the application of an energy source leads to a local melting of the metal allowing diffusion of liquid or softened metal into the microscopic crevices of the substrates, hence increase the area of contact and hence form a bond. For example such metals are noble metals. The applicant has found that in particular gold is well suitable for bonding the two substrates.

It has also been found that combinations of metals from the above described two groups work well, for example, an alloy of Gold and Tantalum is especially preferred in which gold softens and wets the bonding surfaces, while Tantalum forms oxo bridged structures across the interface.

In an embodiment of the method according to the invention step d) is performed by urging the two substrates together.

Due to such a mechanical pressure the thin film metal layer may deform, such that the bond between the two substrates and the intermediate thin film metal layer is strengthened. The applicant has found that strengthening the bond by means of mechanical pressure is especially suitable if use is made of a relatively soft thin film metal layer, such as gold.

Alternatively or additionally step (d) is performed by at least locally heating said thin film metal layer. By means of at least locally heating said thin film metal layer at least a local substrate-metal-substrate joint is generated, such that the bonding between the two substrates and the thin film metal layer is at least locally strengthened.

Such (locally) heating of the thin film metal layer may be performed by means of a laser wherein at least one of the substrates is transparent for said laser, an electric current, microwave radiation or ultrasonic energy.

Heating said thin film metal layer by means of a laser has the advantage that the thin film metal layer absorbs the laser radiation, because at least one of the two substrates is transparent for said laser, such that the temperature of the two substrates is not, or only slightly, increased. Due to that the temperature of the two substrates is not, or only slightly, increased, this method is suitable for temperature sensitive devices, for example said devices provided with an organic-based anti-stiction coating and/or immobilized molecules. Temperature sensitive devices are defined here as devices that cannot be heated to a temperature of 100° C. or more without damage. Said laser is preferably a pico-, femto-, or attoseconds laser which generates short high power pulses. In particular laser pulses in green or near infrared and of pulse width in the range of 0.1-20 picoseconds is preferred, since such a laser pulse has a high peak power, in the range of 10-1000 MW, while delivering a small energy per pulse, preferably in the range of 10-1000 micro joules. Longer laser pulses (e.g., those of duration 1-20 nanoseconds) deliver more energy per pulse and a lower peak power, while shorter laser pulses (less than 0.1 picoseconds) deliver too low an amount of energy per pulse (less than 10 micro joules per pulse without amplification) and increase processing time. This combination of peak power and energy per pulse promotes photoinonization and ultrarapid (supersonic) transfer of energy via ballistic electrons that are formed by photoionization of the metal coating, while the extent of heat transfer through a diffusion wave (sonic or subsonic) remains relatively unimportant (less than 10% of the total energy delivered). This mode of energy transfer keeps the temperature rise (defined as a rise in temperature of 10° C. or more) confined to within 1-10 microns, leading to the maximum utilization of applied energy to bond formation rather than dissipation by heating the substrates. In particular such a combination of peak power and energy per pulse offers optimization of the laser bonding process that minimizes: laser induced damage (including ablation), diffusive dispersion of laser energy in the form of heat, causing temperature rise in areas adjacent to the bond line, and processing time. Such a bonding process is preferred for fabrication of hermetically sealed packages for use in implants, or bond lines situated less than 1 mm from temperature sensitive MEMs or microfluidic components.

As a result of that the thin film metal layer is, at least partially, electrically conductive, an electric current may be applied to the thin film metal layer. As a result of resistive heating the thin film metal layer is heated and the bonding between the thin film metal layer and the two substrates is strengthened. Due to that only the thin film metal layer is heated, the temperature of the two substrates is not, or only slightly, increased, such that this method is also suitable for temperature sensitive devices.

By means of microwave radiation the thin film metal layer is heated due to dielectric heating. Due to that only the thin film metal layer is heated, the temperature of the two substrates is not, or only slightly, increased, such that this method is also suitable for temperature sensitive devices.

Alternatively, ultrasonic energy may be used to heat the thin film metal layer.

Alternatively or additionally step (d) is performed by heating the two substrates and the intermediate thin film metal layer in an oven. The oven may be set to any desired temperature. Due to the presence of the intermediate thin film metal layer according to the invention, lower temperatures may be required in order to have a bonding between the intermediate thin film metal layer and the two substrates, such that the oven may be set to a temperature 200° C. or lower.

In addition to said heating by means of an oven, mechanical pressure for pressing the two substrates together as described above may be applied. Such a combination of heating and mechanical pressure for strengthening the bond between the thin film metal layer and the two substrates has found to be especially suitable if a relatively soft metal, for example copper or gold, is used.

Alternatively or additionally step (d) is performed by applying an underpressure, for example a vacuum, to the two substrates and the intermediate thin film metal layer. Any water present between the two substrates and the intermediate thin film metal layer is thereby removed, such that the bond is strengthened. An underpressure is defined as a pressure below atmospheric pressure.

In another embodiment of the method according to the invention:

at least one of the two substrates provided in step (a) comprises a cavity;

step (b) is performed such that said thin film metal layer surrounds a portion of the surface of the first substrate;

step (c) is performed such that after step (c), said portion, said cavity, and the inner surface of the thin film metal layer directed to said portion, define an inner space between said two substrates, and step (d) is performed such that a sealing of the inner space between said two substrates is provided.

The cavity may be a blind hole or a through hole in the substrate. In one embodiment of the method the portion may comprise the cavity, such that step (b) is performed such that said thin film metal layer surrounds the cavity in the surface of the first substrate. Alternatively, the cavity may be included in the other substrate. In that case the two substrates are brought into contact with each other in such a manner that the portion and the cavity mate.

The sealing may be hermetic, watertight, or dust tight, depending on the application of the device. A hermetic sealing is defined here as helium leak tight according to predetermined standards. Due to such a sealing electrical and/or mechanical and/or chemical and/or optical components and/or microfluidic structures present in the inner space between the two substrates are hermetic, watertight, or dust tight sealed from the outside environment, thus making the device comprising said two substrates and the intermediate thin film metal layer suitable to be used as a MEMS device or a microfluidic device. A hermetically sealed device is especially suitable as an implantable device.

In yet another embodiment of the method according to the invention step (b) is performed such that it allows at least a part of said thin film metal layer to be used as an electrical connection and/or an optical element and/or a chemical element.

An advantage of having step (b) performed such that it allows at least a part of said thin film metal layer to be used as an electrical connection and/or an optical element and/or a chemical element is that said thin film metal layer may be used for bonding the two substrates as well as for providing integrated electrical and/or optical and/or chemical structures, such that the resulting device is suitable to be used as a MEMS device. Such chemical components may comprise a catalytic layer, a sensor or a reactive layer. Such optical components may comprise a light blocking layer, a filter and a sensor. Said part of the thin film metal layer is preferably arranged at least partly within the inner space between the two substrates. The thin film metal layer may be deposited on the first substrate by using standard lithographical techniques. Optionally, said part is not heated during any heating step.

Optionally step (b) is performed such that said part of said thin film metal layer that forms the electrical connection extends from the inside of the inner space to the outside of the inner space.

In even another embodiment of the method according to the invention said heating is performed by irradiating a predetermined pattern in the thin film metal layer by means of a laser, wherein at least one of the substrates is transparent for said laser, and wherein said pattern defines an unirradiated second pattern that is electrically conductive.

By heating a predetermined pattern of the thin film metal layer by means of a laser a substrate-metal-substrate joint is formed according to said pattern. If said laser has suitable power, for example higher than 100 mW, said laser creates a non-conductive pattern in the thin film metal layer. This is a result of that the irradiated parts of the thin film metal layer diffuse into the surrounding parts of the substrates. The part of the thin film metal layer that is not irradiated, which part is a second pattern defined by the predetermined irradiated pattern, remains electrically conductive. This embodiment of the method according to the invention thus has the advantage that simultaneously a bonding between the two substrates and the intermediate thin film metal layer is formed as well as an electrically conductive pattern.

Said irradiated pattern that is non-conductive may also be used for breaking electrical circuits of the otherwise conductive metal layer. For example, if said metal layer surrounds an inner space, in which inner space a component may be located, an irradiated pattern may be formed by said laser that crosses through the surrounding metal layer, such that no electric circuit is formed around said inner space. Such an embodiment is especially advantageous if said component is any component sensitive to interference from a closed conduction circuit, for example a magnetic sensor or a wireless communication device.

In an embodiment of the method according to the invention said unirradiated second pattern extends from the inside of an inner space or the inner space to the outside of the inner space.

This embodiment offers the advantage that the laser welds become electrically non-conductive in order to define electrical connections between the inside and outside of the inner space.

Preferably, said thin film metal layer is biocompatible, which biocompatible layer comprises tantalum, gold and titanium, such that the resulting device may be used in implantable electrical, mechanical and/or optical devices.

In a further embodiment of the method according to the invention said method comprises the steps, to be performed after step (b) and before step (c), of:

e) depositing a resist on said thin film metal layer;

f) patterning said resist and said thin film metal layer on said part of the surface of the first substrate;

g) etching said first substrate comprising said thin film metal layer and said resist such that at least one microstructure is formed in said first substrate; and h) removing said resist such that said thin film metal layer remains on said first substrate.

An advantage of steps (e) to (h) is that the thin film metal layer may be used as a mask layer as conventionally used in micromachining, such that the at least one microstructure may easily be formed in said first substrate by using conventional etching techniques. Conventional etching techniques and etching means, suitable for etching of glass and/or silicon and/or ceramics may be used.

After step (g) it is possible that some parts of the thin film metal layer overlap the microstructures. Due to that they overlap, a surface of the overlapping parts that is directed away from the resist is not covered by the resist and/or the first substrate, such that that surface of the overlapping part may be exposed to etching in order to adapt the width of the thin film metal layer to the width of the microstructure. In accordance herewith, said method preferably comprises the following step, to be performed after step (g) and before step (h), of:

i) etching parts of said thin film metal layer that overlap said microstructure to compensate for underetching.

Any conventional etching techniques and etching means, suitable for etching of said metal may be used.

In a further embodiment of the method, according to claim 13 as dependent on 9, the sealing of the inner space between said two substrates is hermetic, and said method comprises the step of:

j) arranging temperature-sensitive components in the inner space.

The hermetic sealing allows for the arrangement of non-biocompatible, temperature sensitive components, such as liquid crystals or CMOS chips, in the inner space of an implantable device, by fully containing said components inside said device.

The invention also relates to a device, comprising two substrates, for example made from glass, silicon, ceramic, aluminum, or boron, and an intermediate thin film metal layer, which device comprises an inner space between the two substrates, which inner space is surrounded by said intermediate thin film metal layer that hermetically seals the inner space, wherein the thin film metal layer is biocompatible, and wherein temperature-sensitive components are arranged in said inner space.

Such a device has the advantage that the hermetic sealing allows for the arrangement of non-biocompatible, temperature sensitive components, such as liquid crystals or CMOS chips, in the inner space of an implantable device, by fully containing said components inside said device.

The invention further relates to the use of a thin film metal layer for bonding two substrates, for example made from glass, silicon, ceramic, aluminum, or boron, and for providing an electrical connection and/or an optical component and/or a catalytic component.

Figure 1A:
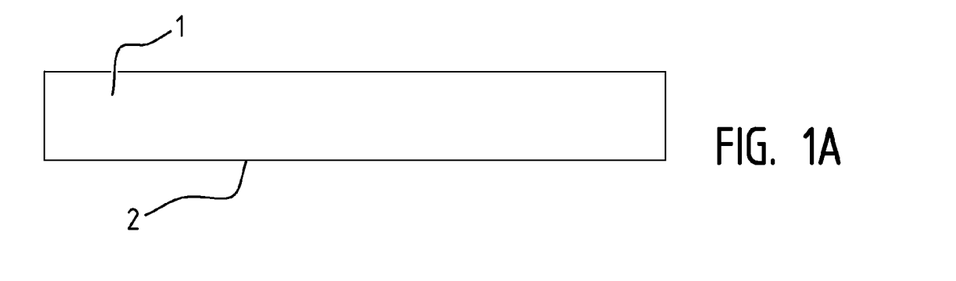
FIGS. 1A-1C show the steps of a first embodiment of the method according to the invention.
Figure 1B:
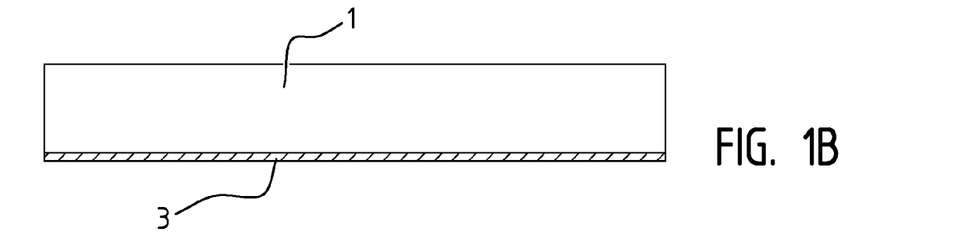
Figure 1C:
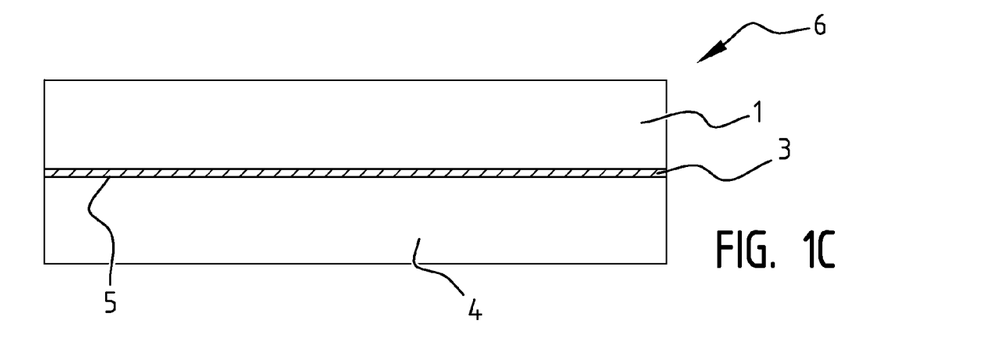

The invention will now be explained in more detail with reference to figures illustrated in a drawing, wherein:

FIGS. 1A-1C show the steps of a method for bonding two substrates, for example made from glass, silicon or ceramic, using an intermediate thin film metal layer.

FIG. 1A shows the first step of the method, wherein a first substrate 1 is provided. In this first step, a surface 2 of the substrate 1 is cleaned by means of conventional suitable cleaning means. Said surface 2 is the lower main surface of the two main surfaces extending in the longitudinal direction of said substrate 1.

Next, in the second step, a thin film metal layer 3 is deposited on the cleaned surface 2 of said substrate 1, as is shown in FIG. 1B. Due to that said surface 2 is cleaned, the thin film metal layer 3 adheres well to that surface 2.

In the third step, see FIG. 1C, the thin film metal layer 3 on the surface 2 of the first substrate 1 is brought into contact with a surface 5 of a second substrate 4, such that a bonding between the second substrate 4 and the thin film metal layer 3 on the first substrate 1 is provided. In order to have a relatively strong initial bonding the surface 5 is cleaned by means of conventional suitable cleaning means. Said surface 5 is the upper main surface of the two main surfaces extending in the longitudinal direction of said substrate 4.

After step three a device 6 is formed, comprising the two substrates 1, 4 and the intermediate thin film metal layer 3, and with an initial bonding that is strong enough for allowing for an easy handling of the device 6. However, in order to use the device 6, for example as a MEMS device, the initial bonding between the thin film metal layer 3 and the two substrates 1, 4 needs to be strengthened in a fourth step. Due to the thin film metal layer 3 according to the invention, various ways of strengthening the bond are possible, as is described above.

Optionally the device 6 may be cut into a plurality of parts, wherein each part is a device according to the invention. Production costs are significantly reduced if a relatively large device comprising two substrates and the intermediate thin film metal layer is formed and then cut into a plurality of devices.

It is noted that said thin film metal layer 3 may be deposited on another surface of the first substrate 1, and that another surface of the second substrate 4 may be brought into contact with the surface of the first substrate 1 on which said thin film metal layer 3 is deposited.

Figure 2:
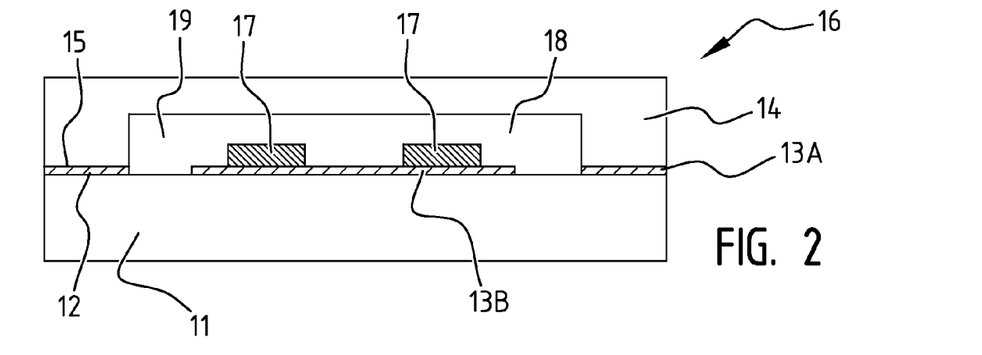
FIG. 2 shows a device produced by a second embodiment of the method according to the invention.

FIG. 2 shows a device 16 produced by a second embodiment of the method according to the invention. The second embodiment of the method differs from the embodiment shown in FIGS. 1A-1C in that, in the second step, a thin film metal layer 13 is deposited on a cleaned surface 12 of a first substrate 11 according to a predetermined pattern. The cleaned surface 12 is in this embodiment the upper main surface of the two main surfaces extending in the longitudinal direction of said substrate 11.

The predetermined pattern comprises an outer thin film metal layer 13A, which outer layer 13A surrounds a portion of the surface 12 of the first substrate 11, such that after the second substrate 14 is brought into contact with the first substrate 11, said portion defines a part of an inner space 18 between said two substrates 11, 14. The second substrate 14 comprises a cavity or recess 19, such that said inner space 18 is defined by said recess 19, the portion of said first substrate 11, and the inner surface of the thin film metal layer directed to said portion. After strengthening the bond between said outer thin film metal layer 13A and the two substrates 11, 14 in the fourth step, a hermetic sealing of the inner space 18 between said two substrates 11, 14 is provided.

The predetermined pattern further comprises an inner thin film metal layer 13B, which inner layer 13B is located near the center of the first substrate 11. The inner layer 13B is used as an electrical connection between components 17. If heating is used as the method step for strengthening the bond between the intermediate thin film metal layer, said inner thin film metal layer 13B is optionally not heated.

A device 16 comprising said two substrates 11, 14, an intermediate thin film metal layer 13 and a hermetically sealed inner space 18 between said two substrates 11, 14 is thus produced. In the inner space 18 electrical and/or mechanical and/or chemical and/or optical components and/or microfluidic structures may be arranged, such that such components or structures are hermetically sealed from the outside environment.

FIGS. 3A-3E shows the steps of a third embodiment of the method according to the invention.

Figure 3A:
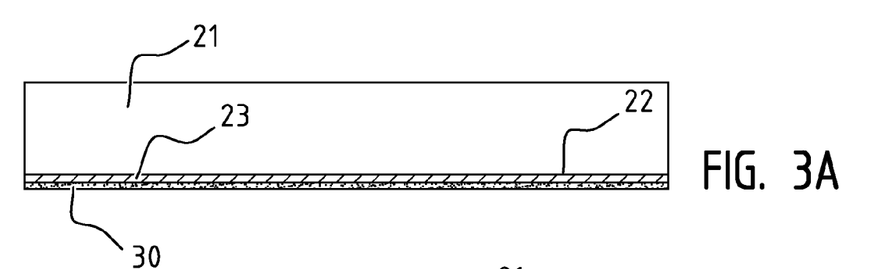
FIGS. 3A-3E show the steps of a third embodiment of the method according to the invention.

In FIG. 3A a first substrate 21 is provided. On a surface 22 of the first substrate 21 is a thin film metal layer 23 and a resist 30 deposited.

Figure 3B:
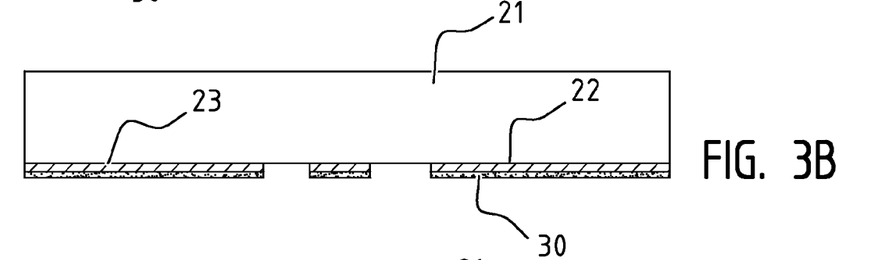

In a next step the resist 30 and said thin film metal layer 23 on the surface 22 of the first substrate 21 are patterned, see FIG. 3B, such that parts of the first substrate 21 to be etched are exposed.

Figure 3C:
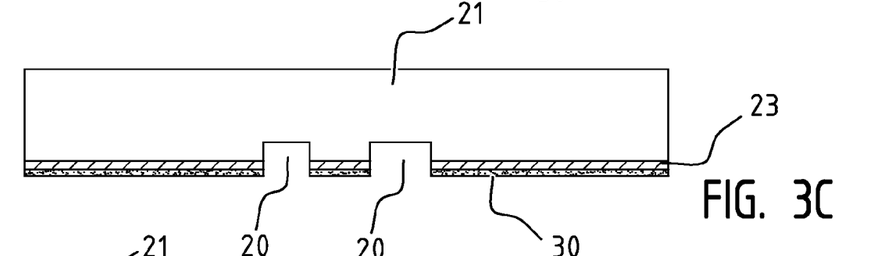

In FIG. 3C said first substrate 21 comprising said thin film metal layer 23 and said resist 30 are etched such that two microstructures 20 is formed in said first substrate 21. Said etching is performed by means of conventional etching techniques and etching means, for example by means of hydrofluoric acid (HF) etching.

Figure 3D:
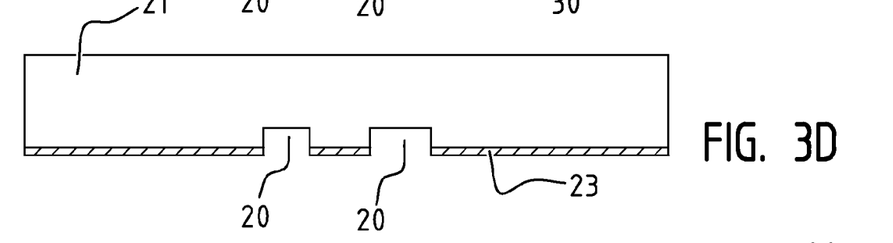

In FIG. 3D said resist 30 is removed such that said thin film metal layer 23 remains on said first substrate 21.

Figure 3E:
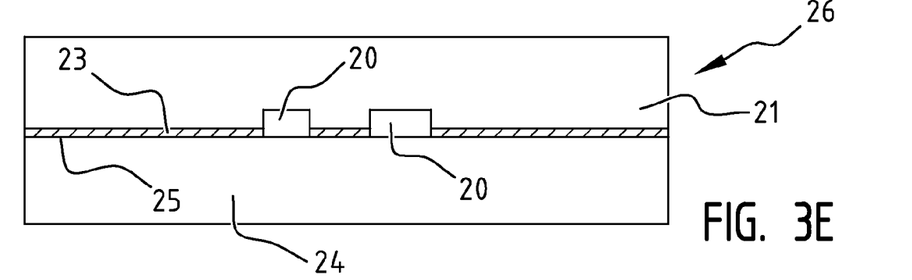

In a last step the thin film metal layer 23 on the surface 22 of the first substrate 21 is brought into contact with a surface 25 of a second substrate 24, such that a bonding between the second substrate 24 and the thin film metal layer 23 on the first substrate 21 is provided, see FIG. 3E. This bonding is then strengthened with use of a strengthening step as described above. A device 26 comprising two substrates 21, 24, an intermediate thin film metal layer 23 and two microstructures 20 is thus produced.

Figure 4A:
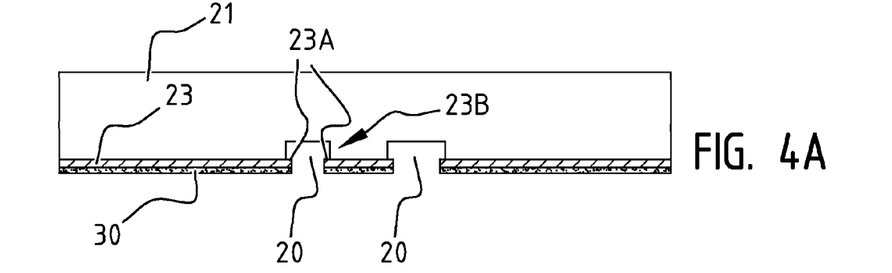
FIGS. 4A and 4B show two additional steps of the method of FIGS. 3A-3E.
Figure 4B:
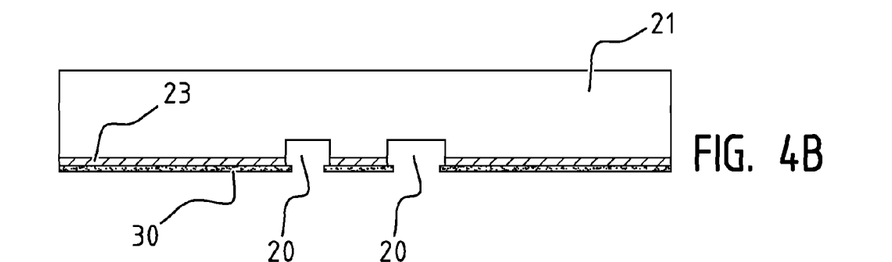

FIGS. 4A and 4B show two additional steps of the method of FIGS. 3A-3E, which two additional steps are to be performed optionally. FIG. 4A shows the first substrate 21, the thin film metal layer 23 and the resist 30 after etching the two microstructures 21, which figure corresponds to FIG. 3C. However, as FIG. 4A shows, parts 23A of the thin film metal layer 23 overlap the microstructures 20. This could for example be due to an isotropic etching behaviour, in which an undercutting of the etch mask occurs. Due to that said parts 23A overlap, a surface 23B of the overlapping parts 23A that is directed away from the resist 30 is not covered by the resist 30 and the first substrate 21. This exposed surface 23B of the overlapping part 23A is etched in order to adapt the width of the thin film metal layer 23 to the width of the microstructure 20, see FIG. 4B. Said etching is performed by means of conventional etching techniques and etching means, for example by means of wet chemical etching.

Figure 5:
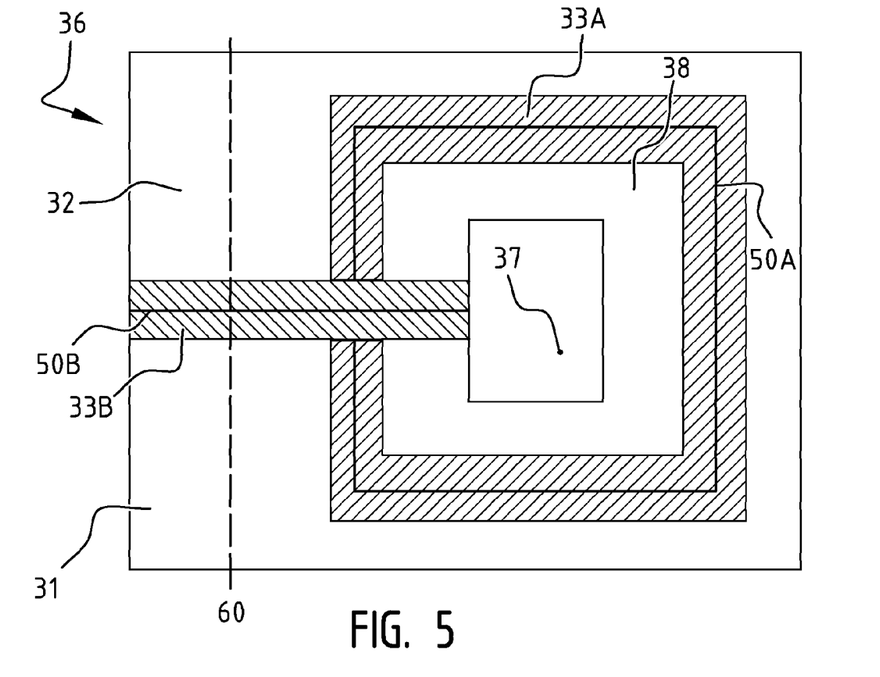
FIG. 5 shows a second embodiment of a device produced by a fourth embodiment of the method according to the invention.

FIG. 5 shows a second embodiment of a device 36 produced by a fourth embodiment of the method according to the invention. In accordance with the second embodiment of the method, in the second step, a thin film metal layer 33 is deposited on a cleaned surface 32 of a first substrate 31 according to a predetermined pattern. The predetermined pattern comprises a first thin film metal layer 33A, which first layer 33A surrounds a portion of the surface 32 of the first substrate 31, such that after the second substrate (not shown) is brought into contact with the first substrate 31, said portion defines an inner space 38 between said two substrates. The predetermined pattern further comprises a second thin film metal layer 33B, which layer 33B extends from the inside of the inner space 38 to the outside of the inner space 38. A laser is used for strengthening the bond over a laser weld 50A, 50B. The laser used has suitable power, for example higher than 100 mW, such that the thin film metal layers 33A, 33B of the welds 50A, 50B diffuse into parts of the substrates that surround the welds 50A, 50B and thus those welds 50A, 50B become electrically non-conductive. These welds 50A, 50B define unirradiated patterns in the layers 33A, 33B that remain electrically conductive. The two unirradiated parts of the second layer 33B separated by weld 50B form electrical connections between the inside of the inner space 38 and the outside of the inner space 38. By means of weld 50A the inner space 38 is dust tight sealed. An electrical and/or optical and/or a chemical component 37 is arranged within the inner space 38. The device 36 may be cut over the dot line 60, which dot line 60 is perpendicular with respect to the longitudinal direction of the second layer 33B, such that the part of the device 36 comprising the inner space 38 may be used as a separate device and the other part (only partly shown) may also be used as a separate device.

FIG. 5 further shows two irradiated patterns 150A, 150B, that cross through the metal layer 33A that surrounds the inner space 38. By crossing through the metal layer 33A said irradiated patterns 150A, 150B break the electric circuit that would otherwise be formed by the surrounding metal layer 33A. Said irradiated patterns 150A, 150B cross the metal layer 33A in the transverse direction.

Figure 6:
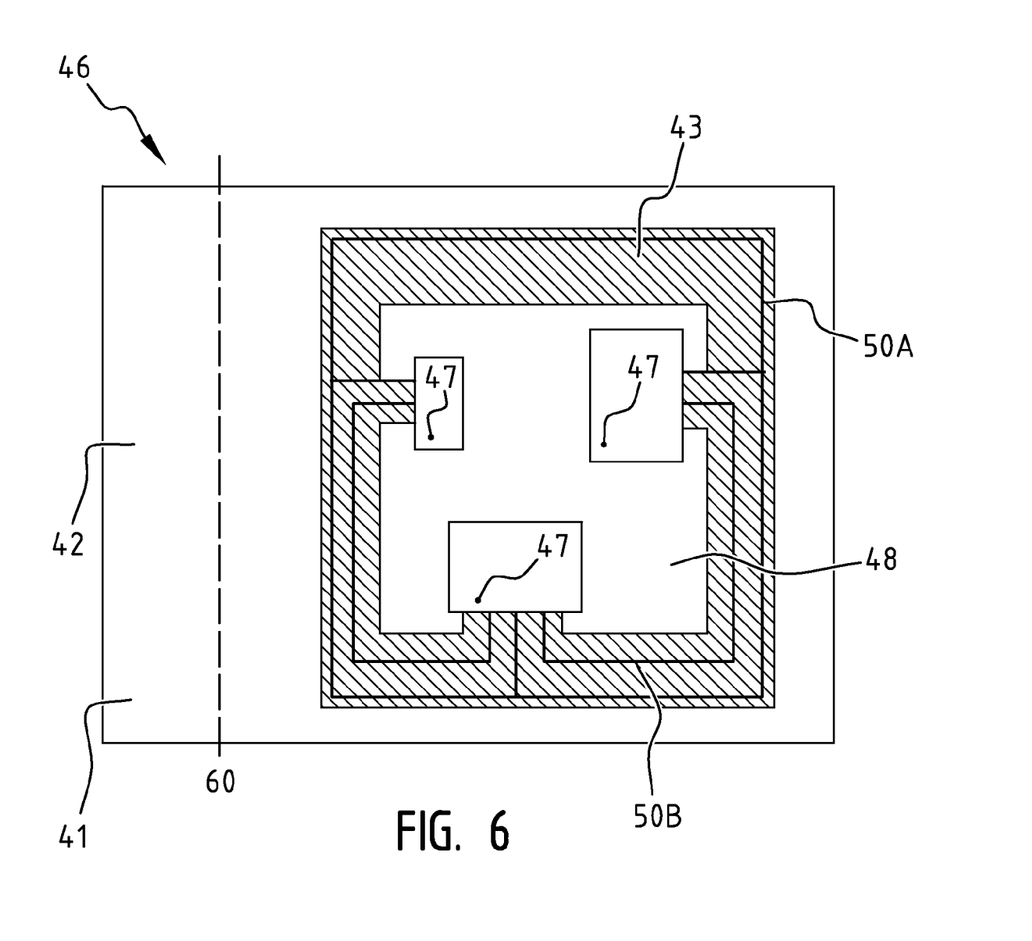
FIG. 6 shows a third embodiment of a device produced by a fifth embodiment of the method according to the invention.

FIG. 6 shows a third embodiment of a device 46 produced by a fifth embodiment of the method according to the invention. In accordance with the second and fourth embodiment of the method, in the second step, a thin film metal layer 43 is deposited on a cleaned surface 42 of a first substrate 41 according to a predetermined pattern. The predetermined pattern comprises a thin film metal layer 43, which surrounds a portion of the surface 42 of the first substrate 41, such that after the second substrate (not shown) is brought into contact with the first substrate 41, said portion defines a part of an inner space 48 between said two substrates. A laser is used for strengthening the bond over a laser weld 50A, 50B. As described above, as a result of the suitable laser power, the thin film metal layer 43 of the welds 50A, 50B diffuse into parts of the substrates that surround the welds 50A, 50B and thus those welds 50A, 50B become electrically non-conductive. These welds 50A, 50B define unirradiated patterns in the layer 43 that remain electrically conductive and which patterns function as electrical connections between the components 47. By means of weld 50A the inner space 48 is hermetically sealed. As described above, the device 46 may be cut over the dot line 60, which dot line is perpendicular to the longitudinal direction of the first substrate 41, such that the part of the device 46 comprising the inner space 48 may be used as a separate device and the other part (only partly shown) may also be used as a separate device.

Figure 7:
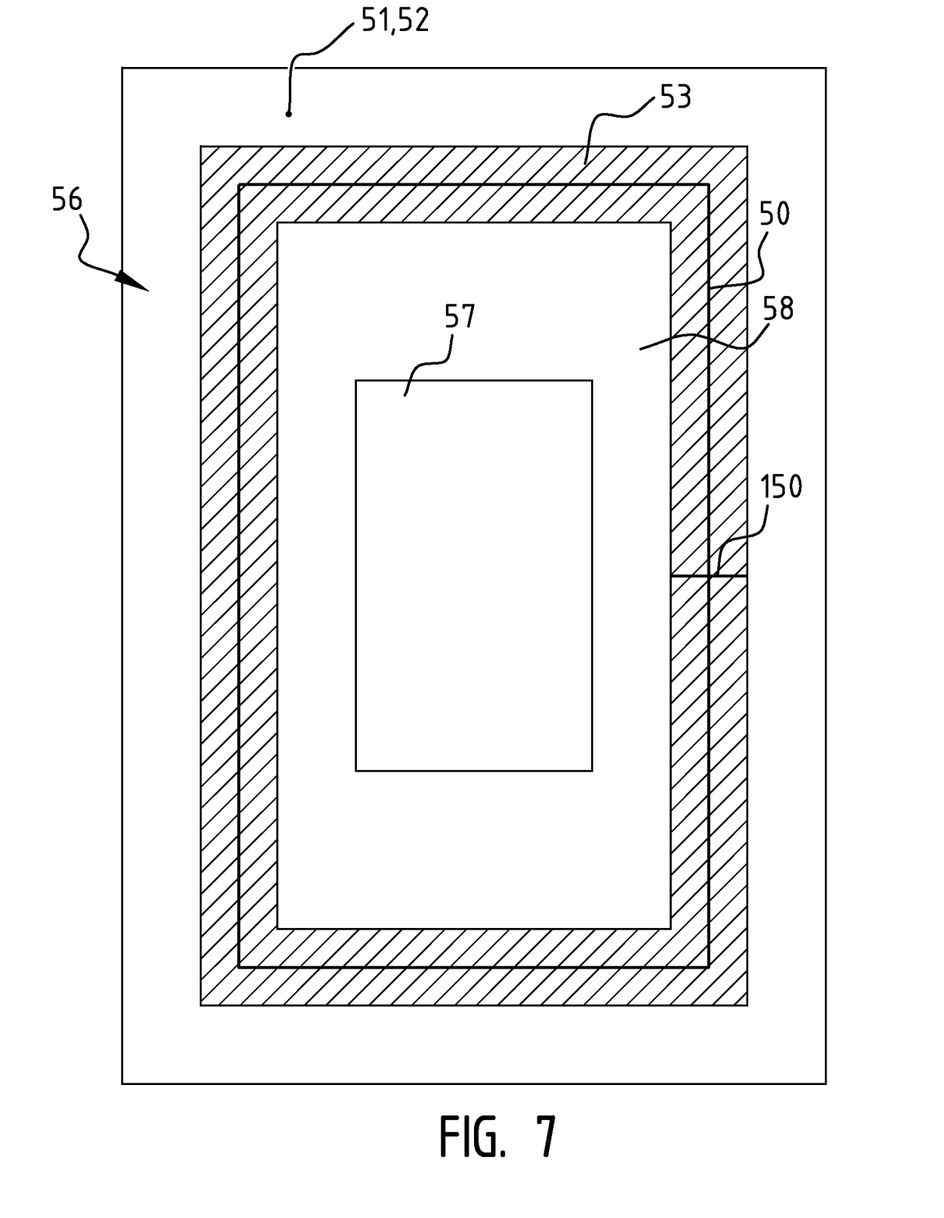
FIG. 7 shows a fourth embodiment of a device produced by a sixth embodiment of the method according to the invention.

FIG. 7 shows a fourth embodiment of a device 56 produced by a sixth embodiment of the method according to the invention. In accordance with the second and fourth embodiment of the method, in the second step, a thin film metal layer 53 is deposited on a cleaned surface 52 of a first substrate 51 according to a predetermined pattern. The predetermined pattern comprises a thin film metal layer 53, which surrounds a portion of the surface 52 of the first substrate 51, such that after the second substrate (not shown) is brought into contact with the first substrate 51, said portion defines a part of an inner space 58 between said two substrates. A laser is used for strengthening the bond over a laser weld 50, that extends in the longitudinal direction of the thin film metal layer 54 over the entire length thereof. As described above, as a result of the suitable laser power, the thin film metal layer 53 of the weld 50 diffuses into parts of the substrates that surround the weld 50 and thus becomes weld 50 electrically non-conductive. By means of weld 50 the inner space 58 is hermetically sealed. Said laser is further used for forming a second laser weld or irradiated pattern 150 that extends in the transverse direction of the thin film metal layer 54 over the entire width thereof. As a result of said irradiated pattern 150 crossing through the metal layer 53 that surrounds the inner space 58, said irradiated pattern 150 breaks the electric circuit that would otherwise be formed by the surrounding metal layer 53. As such, interference from a closed conduction circuit is prevented, such that the component 57 located in the inner space may be any component sensitive to interference from a closed conduction circuit, for example a magnetic sensor or a wireless communication device.

It is noted that such an irradiated pattern crossing through the thin metal layer is also shown in FIG. 5, as described above. FIG. 7 shows that this feature according to the invention may also be applied without an electrical connection between the inside of the inner space to the outside of the inner space.

The invention is not restricted to the variants shown in the drawing, but it also extends to other preferred embodiments that fall within the scope of the appended claims.

The invention claimed is:

1. A method for bonding at least two substrates using an intermediate metal film for providing the bonding, said method comprising the following steps of:
   a) providing said two substrates, wherein at least one substrate comprises glass, silicon, ceramic or a combination thereof;
   b) depositing said metal film on at least a part of a surface of a first substrate of the two substrates;
   c) bringing a surface of the second substrate into contact with said metal film on said surface of the first substrate such that an initial bonding between the second substrate and the metal film on the first substrate is provided; and
   d) at least locally strengthening the bonding between the second substrate and the metal film on the first substrate;
   wherein the method further comprises a step of cleaning the first substrate and/or the second substrate at least previous to step (b) and/or step (c) in order to enhance the strength of said initial bond between the second substrate and the metal film on the first substrate.

2. The method according to claim 1, wherein said metal film comprises a metal chosen from the group consisting of palladium, copper, tungsten, aluminum, cobalt, nickel, thalium, ruthenium, iron, molybdenum, stainless steel, chromium, tantalum, vanadium and titanium, and wherein said metal film comprises a metal oxide layer.

3. The method according to claim 1, wherein said metal film comprises a metal chosen from the group consisting of silver, platinum and gold.

4. The method according to claim 1, wherein step d) is performed by urging the two substrates together.

5. The method according to claim 1, wherein step (d) is performed by at least locally heating said metal film.

6. The method according to claim 5, wherein said heating is performed by a laser and at least one of the substrates is transparent for said laser, an electric current, microwave radiation or ultrasonic energy.

7. The method according to claim 1, wherein step (d) is performed by heating the two substrates and the intermediate metal film in an oven.

8. The method according to claim 1, wherein step (d) is performed by applying an underpressure to the two substrates and the intermediate metal film.

9. The method according to claim 1, wherein:
- at least one of the two substrates provided in step (a) comprises a cavity;
- step (b) is performed such that said metal film surrounds a portion of the surface of the first substrate;
- step (c) is performed such that after step (c), said portion, said cavity, and the inner surface of the metal film directed to said portion, define an inner space between said two substrates, and
- step (d) is performed such that a sealing of the inner space between said two substrates is provided.

10. The method according to claim 1, wherein step (b) is performed such that it allows at least a part of said metal film to be used as an electrical connection and/or an optical element and/or a chemical element.

11. The method according to claim 9, wherein step (b) is performed such that it allows at least a part of said metal film to be used as an electrical connection and/or an optical element and/or a chemical element and said part of said metal film that forms the electrical connection extends from the inside of the inner space to the outside of the inner space.

12. The method according to claim 5; wherein said heating is performed by irradiating a predetermined pattern in the metal film by means of a laser, wherein at least one of the substrates is transparent for said laser, wherein said pattern defines an unirradiated second pattern that is electrically conductive.

13. The method according to claim 9, wherein said irradiated pattern crosses through said surrounding metal film in order to break an electrical circuit of the metal film.

14. The method according to claim 12, wherein said unirradiated second pattern extends from the inside of an inner space or the inner space to the outside of the inner space.

15. The method according to claim 1, wherein said metal film is biocompatible.

16. The method according to claim 1, comprising the steps, to be performed after step (b) and before step (c), of:
- e) depositing a resist on said metal film;
- f) patterning said resist and said metal film on said part of the surface of the first substrate;
- g) etching said first substrate comprising said metal film and said resist such that at least one microstructure is formed in said first substrate; and
- h) removing said resist such that said metal film remains on said first substrate.

17. The method according to claim 16, comprising the step, to be performed after step (g) and before step (h), of:
- i) etching parts of said metal film that overlap said microstructure to compensate for underetching.

18. The method according to claim 9, wherein the sealing of the inner space between said two substrates is hermetic, and comprises the step of:
- j) arranging temperature-sensitive components in the inner space.

19. The method according to claim 1, wherein the at least two substrates are made from glass, silicon, ceramic, aluminum, or boron.

20. The method according to claim 8, wherein the underpressure comprises a vacuum.

* * * * *